United States Patent
Li et al.

(10) Patent No.: US 12,494,790 B2
(45) Date of Patent: Dec. 9, 2025

(54) METHOD FOR CORRECTING ANALOG-TO-DIGITAL CONVERTER

(71) Applicant: CHINA ELECTRONICS TECHNOLOGY GROUP CORPORATION NO. 24 RESEARCH INSTITUTE, Chongqing (CN)

(72) Inventors: Ting Li, Chongqing (CN); Ruzhang Li, Chongqing (CN); Yong Zhang, Chongqing (CN); Yabo Ni, Chongqing (CN); Liang Li, Chongqing (CN); Huaiqiang Yu, Chongqing (CN); Chao Chen, Chongqing (CN); Dongbing Fu, Chongqing (CN); Jianan Wang, Chongqing (CN); Guangbing Chen, Chongqing (CN)

(73) Assignee: CHINA ELECTRONICS TECHNOLOGY GROUP CORPORATION NO. 24 RESEARCH INSTITUTE, Chongqing (CN)

( * ) Notice: Subject to any disclaimer, the term of this patent is extended or adjusted under 35 U.S.C. 154(b) by 131 days.

(21) Appl. No.: 18/398,111

(22) Filed: Dec. 27, 2023

(65) Prior Publication Data
US 2024/0291496 A1    Aug. 29, 2024

Related U.S. Application Data

(63) Continuation of application No. PCT/CN2023/096787, filed on May 29, 2023.

(30) Foreign Application Priority Data

Dec. 31, 2022 (CN) .......................... 202211735360.7

(51) Int. Cl.
H03M 1/06 (2006.01)

(52) U.S. Cl.
CPC .................. *H03M 1/0604* (2013.01)

(58) Field of Classification Search
CPC .................................................. H03M 1/0604
See application file for complete search history.

(56) References Cited

U.S. PATENT DOCUMENTS

| 6,515,611 | B1 * | 2/2003 | Fetterman | H03M 1/0673 |
|---|---|---|---|---|
| | | | | 341/172 |
| 7,088,278 | B2 * | 8/2006 | Kurose | H03M 1/123 |
| | | | | 341/161 |

(Continued)

FOREIGN PATENT DOCUMENTS

| CN | 109756226 A | 5/2019 |
|---|---|---|
| CN | 110336561 A | 10/2019 |

(Continued)

*Primary Examiner* — Thomas D Alunkal

(57) ABSTRACT

A method for correcting an analog-to-digital converter includes the following steps: extracting gain errors and weight errors of all conversion stages of an analog-to-digital converter; performing first correction on the analog-to-digital converter based on the gain errors and the weight errors; extracting jitter errors of all conversion stages of the analog-to-digital converter after the first correction; and performing a second correction on the analog-to-digital converter based on the jitter errors. According to the disclosure, the gain errors, the weight errors, and the jitter errors of all conversion stages are successively extracted, and then the analog-to-digital converter is corrected. Precision after the corrections is higher. An actual weight of each quantization unit at each conversion stage, an actual inter-stage gain of each conversion stage and an actual weight of jitter are extracted, impact of a jitter weight is eliminated during outputting, and a signal-to-noise ratio of analog-to-digital conversion is increased.

12 Claims, 5 Drawing Sheets

(56) References Cited

U.S. PATENT DOCUMENTS

| | | | | |
|---|---|---|---|---|
| 7,595,748 B2* | 9/2009 | Tu | ................. | H03M 1/1019 |
| | | | | 341/161 |
| 8,837,656 B2* | 9/2014 | Stojanovic | ............. | H03L 7/091 |
| | | | | 375/355 |
| 8,878,711 B1* | 11/2014 | Loeda Pagliano | ...... | H03M 3/37 |
| | | | | 341/118 |
| 9,219,493 B1* | 12/2015 | Kunnen | ............... | H03M 3/388 |
| 9,246,509 B1* | 1/2016 | Bhargava | .............. | H03M 3/464 |
| 2004/0125008 A1* | 7/2004 | Yamaji | ................. | H03M 1/007 |
| | | | | 341/155 |
| 2013/0120174 A1 | 5/2013 | Ali | | |
| 2014/0152477 A1* | 6/2014 | Lewis | ................ | H03M 1/1061 |
| | | | | 341/122 |
| 2014/0152478 A1* | 6/2014 | Lewis | ................ | H03M 1/0673 |
| | | | | 341/123 |

FOREIGN PATENT DOCUMENTS

| | | |
|---|---|---|
| CN | 114553226 A | 5/2022 |
| CN | 115441869 A | 12/2022 |
| CN | 115940950 A | 4/2023 |

\* cited by examiner

METHOD FOR CORRECTING ANALOG-TO-DIGITAL CONVERTER

CROSS REFERENCE TO RELATED APPLICATION

The present application is a continuation application of PCT Application No. PCT/CN2023/096787, filed on May 29, 2023, which claims the benefit of priority to a Chinese Patent Application number CN202211735360.7, filed on Dec. 31, 2022, the disclosure of the above application is hereby incorporated by reference in its entirety for all purposes.

TECHNICAL FIELD

The disclosure relates to the field of integrated circuit technologies, and in particular, to a method for correcting an analog-to-digital converter.

BACKGROUND

An analog-to-digital converter is an electronic component that converts an analog signal into a digital signal, whose quality of signal collection and conversion depends on the speed and precision thereof. With the development of information technology, the requirement for signal collection and conversion is increasingly high, and a high-speed and high-precision analog-to-digital converter is a hotspot required by an integrated system, where the quality of signal collection and conversion depends on indexes such as the speed, precision and linearity thereof. As the process feature size of a converter decreases, the speed thereof is increasingly high and the intrinsic gain thereof is increasingly small, whereby the speed thereof is enhanced accordingly, and the precision thereof may be continuously decreased. In order to improve the precision of the converter, a weight error and a gain error need to be corrected. In addition, for improving the linearity thereof, jitter will be introduced into a high-performance analog-to-digital converter. If the introduced jitter cannot be eliminated, the precision thereof will be reduced while the linearity is improved. Therefore, in the high-speed and high-precision converter, actual weights, actual gains and jitter weights need to be extracted and corrected, so that high precision and linearity may be implemented while the speed of the converter increases. However, when stages at which errors need to be extracted and corrected become more and more, a conventional error extraction and correction method is no longer applicable consequently.

(1) Conventional test and error extraction methods usually can be used to extract an error of an initial conversion stage only, and cannot be used to extract errors of multiple conversion stages. Therefore, these methods are not applicable to a case in which errors occur at a plurality of conversion stages.

(2) The conventional error extraction method is usually used to extract only a weight mismatch error of a converter, and is not applicable to extraction of a gain error caused by an insufficient gain.

(3) Conventional error extraction does not include a weight error of jitter, and consequently, the linearity of the converter is improved after a jitter is introduced while a signal-to-noise ratio thereof is decreased.

(4) In a conventional error extraction method based on an integral nonlinear error, sample points that need to be collected will be increased exponentially with the improvement of the precision of a converter, causing relatively low efficiencies of test and correction.

Therefore, currently a solution for testing and correcting an analog-to-digital converter is urgently needed to resolve problems that the conventional error test and correction method cannot perform multi-stage and multi-error corrections and the test and correction efficiencies are low.

SUMMARY

In view of the foregoing disadvantages of the conventional technology, an objective of the disclosure is to provide a method for correcting an analog-to-digital converter, so as to resolve problems of that a conventional error test and correction method cannot perform multi-stage and multi-error correction and of low test and correction efficiencies.

To achieve the foregoing objective and other related objectives, the disclosure provides the following technical solutions.

A method for correcting an analog-to-digital converter includes the following steps:
extracting gain errors and weight errors of all conversion stages of an analog-to-digital converter;
performing a first correction on the analog-to-digital converter according to the gain errors and the weight errors;
extracting jitter errors of all the conversion stages thereof after the first correction; and
performing a second correction on the analog-to-digital converter according to the jitter errors.

Optionally, the step of extracting gain errors and weight errors of all the conversion stages thereof includes:
for each conversion stage, configuring an input signal and an output mode;
for each conversion stage, performing a first analog-to-digital conversion test on the analog-to-digital converter according to the input signal and the output mode, to collect first test output data; and
for all the conversion stages, calculating the gain errors and the weight errors of all the conversion stages according to the first test output data.

Optionally, the step of configuring the input signal and the output mode includes:
configuring an amplitude of the input signal of each stage and a threshold voltage of comparators at each stage, and configuring an output interface to send all output results of the comparators at each stage.

Optionally, the analog-to-digital converter includes n conversion stages; when a gain error and a weight error of the $i^{th}$ conversion stage are extracted, the maximum value of the input signal of the $i^{th}$ stage is greater than the maximum comparator threshold of the $i^{th}$ conversion stage, and the minimum value of the input signal of the $i^{th}$ stage is less than the minimum comparator threshold of the $i^{th}$ conversion stage; when i≥2, a threshold voltage of comparators at a pre-stage of the $i^{th}$ stage is configured so that the signal amplitude thereof always does not exceed a comparator threshold; wherein n is an integer greater than or equal to 2, and i is an integer of 1-n.

Optionally, the first test output data at least includes output codes of the comparators at each stage, and the step of calculating the gain errors and the weight errors of all the conversion stages according to the first test output data includes:
calculating an actual output sequence of the analog-to-digital converter according to the output codes of the comparators at each stage;

performing fitting output on the actual output sequence as an ideal output sequence under a constraint of a minimum mean square error according to a characteristic of the input signal;

performing a subtraction operation on the actual output sequence and the ideal output sequence to obtain an error sequence; and calculating the gain errors and the weight errors of the conversion stages according to the error sequence.

Optionally, calculation formulas for the gain error and the weight error are respectively as follows:

$$G_i(m+1) = G_i(m) - \mu_{igk} \frac{D_{ires}(m)}{2^N} \text{err}(m);$$

$$W_{ij}(m+1) = W_{ij}(m) - \mu_{iwk} \frac{d_{ij}(m) W_{ij\_ideal}}{2^N} \text{err}(m);$$

wherein $G_i(m)$ represents the $m^{th}$ iteration value of the gain error of the $i^{th}$ conversion stage, $D_{ires}(m)$ represents the $m^{th}$ iteration value of a residual error of the $i^{th}$ stage, $\mu_{igk}$ represents the $k^{th}$ iteration step size of a gain of the $i^{th}$ stage, $W_{ij}(m)$ represents the $m^{th}$ iteration value of a weight of the $j^{th}$ quantization unit at the $i^{th}$ stage, $d_{ij}(m)$ represents an $m^{th}$ comparator output corresponding to the weight of the $j^{th}$ quantization unit at the $i^{th}$ stage, $\mu_{iwk}$ represents a $k^{th}$ iteration step size of a weight of the quantization unit at the $i^{th}$ stage, $W_{ij\_ideal}$ represents an ideal weight of the $j^{th}$ quantization unit at the $i^{th}$ stage, err(m) represents an error sequence, and N represents a resolution ratio of the analog-to-digital converter.

Optionally, the iterations take a form of a variable step size, and both the iteration step sizes $\mu_{igk}$ and $\mu_{iwk}$ are selected in a descending order, so as to increase a convergence speed thereof.

Optionally, a calculation formula for performing the first correction on the analog-to-digital converter according to the gain errors and the weight errors is as follows:

$$D_{out\_cal} = \sum_{j=1}^{2^{k_1}} d_{1j} \cdot W_{1j} + \sum_{j=1}^{2^{k_2}} d_{2j} \cdot W_{2j} \cdot \prod_{i=1}^{1} G_i +$$
$$\sum_{j=1}^{2^{k_3}} d_{3j} \cdot W_{3j} \cdot \prod_{i=1}^{2} G_i + \ldots + \sum_{j=1}^{2^{k_n}} d_{nj} \cdot W_{nj} \prod_{i=1}^{n-1} G_i;$$

wherein $D_{out\_cal}$ represents a digital output code after the first correction and $2^{k_i}$ (i=1, 2, 3 . . . ) represents a quantity of the quantization units at the $i^{th}$ stage.

Optionally, the step of extracting jitter errors of all the conversion stages of the analog-to-digital converter after the first correction includes:

for each conversion stage, configuring an input signal and an output mode;

for each conversion stage, according to the input signal and the output mode, opening and extracting the jitter digital code of one stage each time, performing a second analog-to-digital conversion test on the analog-to-digital converter after the first correction, and collect second test output data; and for all the conversion stages, calculating the jitter errors of all the conversion stages according to the jitter digital codes and the second test output data.

Optionally, when the jitter errors are extracted, the threshold voltages of the comparators at all the stages are restored to a normal working state.

Optionally, when the jitter errors are extracted, the input signal is set to be a predetermined threshold or the input signal is disabled, so as to increase a convergence speed thereof.

Optionally, the jitter digital codes of one stage are successively opened and extracted, and the order of opening and extracting the jitter digital codes of all the stages is not limited.

Optionally, a calculation formula for calculating the jitter errors of all conversion stages according to the jitter digital codes and the second test output data is as follows:

$$W_{d\_ij}(m+1) = W_{d\_ij}(m) - \mu_{diwk} \cdot dd_{ij}(m) \cdot (W_{d\_ij}(m) \cdot dd_{ij}(m) - D_{out\_cal}(m));$$

wherein $W_{d\_ij}(m)$ represents the $m^{th}$ iteration of the $j^{th}$ jitter error of the $i^{th}$ stage and $\mu_{diwk}$ represents the $k^{th}$ iteration step size of the jitter errors of the $i^{th}$ stage.

Optionally, a calculation formula for performing the second correction on the analog-to-digital converter according to the jitter errors is as follows:

$$D_{out\_cal\_ditheron} = D_{out\_cal} - \sum W_{d\_ij} \cdot dd_{ij};$$

wherein $D_{out\_cal\_ditheron}$ represents a digital output code after the second correction and $dd_{ij}(m)$ represents the jitter digital code.

As described above, the method for correcting an analog-to-digital converter provided in the disclosure brings at least the following beneficial effects:

According to the disclosure, the gain errors, the weight errors, and the jitter errors of all the conversion stages are successively extracted, and two corrections are performed on the analog-to-digital converter. The precision thereof after the correction becomes higher. The actual weight of each quantization unit at each conversion stage is extracted, thereby resolving the problem that the conventional error extraction method can be used to extract the weight of the initial conversion stage only, and cannot be used to extract weights of a plurality of conversion stages. The actual inter-stage gain of each conversion stage is extracted and a performance degradation problem caused by a difference between the actual value and the ideal value of the inter-stage gain is corrected, thereby resolving the problem that the inter-stage gain cannot be extracted by using the conventional method. The actual weight of jitter is extracted the impact of a jitter weight is eliminated during outputting and a signal-to-noise ratio of the analog-to-digital conversion is increased, thereby resolving the problem that the signal ratio of the analog-to-digital conversion decreases because the jitter weight cannot be extracted by using the conventional method.

DESCRIPTION OF EMBODIMENTS

Figure 1:
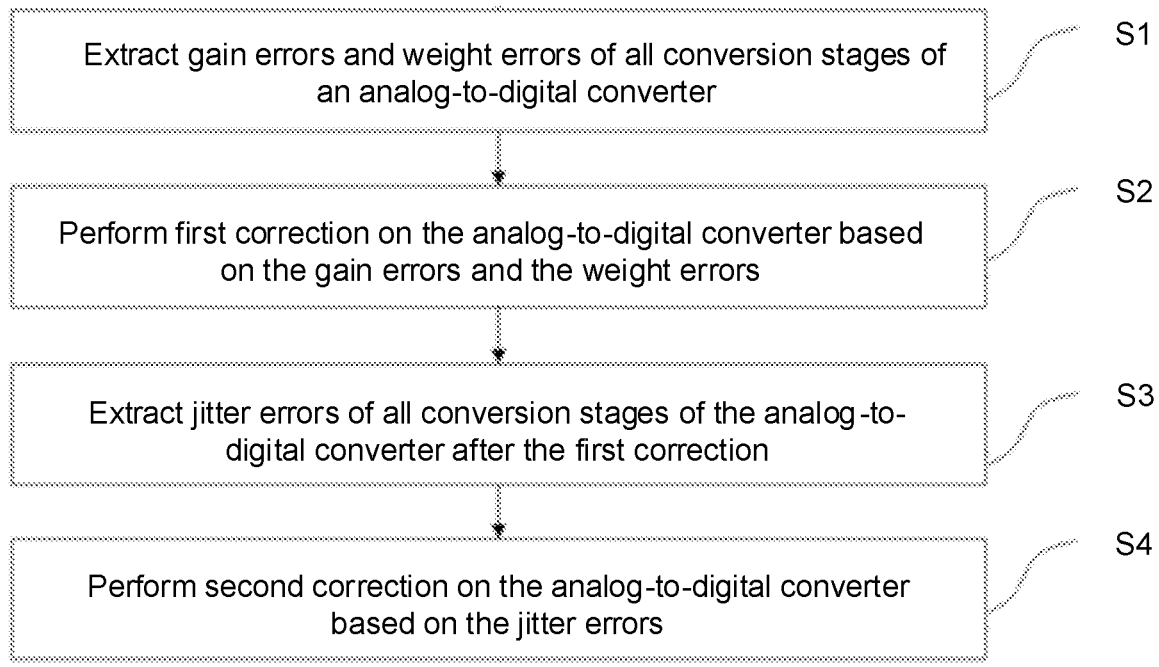
FIG. 1 is a schematic diagram of steps of a method for correcting an analog-to-digital converter according to the disclosure.

As mentioned above in the BACKGROUND section, the inventor finds, through research, that as a process feature size of a converter decreases, the speed thereof becomes increasingly high and an intrinsic gain is increasingly reduced. This increases the speed of the converter, in the meantime also continuously decreases the precision thereof. To improve the precision of the converter, the weight error and the gain error thereof need to be corrected. In addition, in order to improve the linearity thereof, jitters will be introduced into a high-performance analog-to-digital converter. If the introduced jitters cannot be eliminated, the precision of the analog-to-digital converter will be reduced while the linearity is improved. Therefore, in the high-speed and high-precision converter, actual weights, actual gains, and jitter weights need to be extracted and corrected, so that the high precision and linearity may be achieved while the speed of the converter increases. In addition, when stages at which errors need to be extracted and corrected become more and more, and the conventional error extraction and correction method is no longer applicable consequently.

(1) Conventional test and error extraction methods usually can be used to extract an error of an initial conversion stage only, and cannot be used to extract errors of a plurality of conversion stages. Therefore, these methods are not applicable to a case in which errors occur at a plurality of conversion stages.

(2) The conventional error extraction method is usually used to extract only a quantization unit error of a converter, and is not applicable to extraction of a gain error caused by an insufficient gain.

(3) Conventional error extraction does not include a weight error of jitter, and thus lead to a situation that the linearity of the converter is improved after a jitter is introduced while a signal-to-noise ratio thereof decreases.

(4) In a conventional error extraction method according to an integral nonlinear error, sample points that need to be collected increase exponentially with the improvement of the precision of the converter, causing relatively low efficiency of test and correction.

On this basis, the disclosure provides a solution for testing and correcting an analog-to-digital converter. The gain errors, the weight errors, and the jitter errors of all conversion stages are successively extracted, and two corrections are performed on the analog-to-digital converter, so as to improve the correction precision and to implement multi-stage and multi-error extraction thereof.

The following describes some implementations of the disclosure by using some specific examples. A person skilled in the art can easily understand other advantages and effects of the disclosure based on the content disclosed in this specification. The disclosure can be further implemented or applied in some other different specific implementations. Various details in this specification can also be modified or altered based on different viewpoints and applications without departing from the spirit of the disclosure.

References are made to FIG. 1 to FIG. 5. It should be noted that, the illustrations provided in some embodiments merely describe the basic concept of the disclosure by using examples. Although the drawings show only components related to the disclosure, and are not drawn based on a quantity of components, a shape of a component, and a size of a component during actual implementation, a shape, a quantity, and a scale of the components may be arbitrarily changed during actual implementation, and a component layout form may be more complex. The structure, scale, size, and the like shown in the drawings of this specification are merely used to cooperate with the content disclosed in the specification for a person skilled in the art to understand and read, and are not restrictions for limiting implementation of the disclosure, and therefore have no technically substantial significance. Any modification of the structure, change of a proportional relationship or adjustment of the size shall still fall within the scope that can be covered by the technical content disclosed in the disclosure, provided that they do not affect the efficacy that can be generated by the disclosure and the purpose that can be achieved by the disclosure.

As shown in FIG. 1, the disclosure provides a method for correcting an analog-to-digital converter, including the following steps:

S1: extract gain errors and weight errors of all conversion stages of the analog-to-digital converter;

S2: perform a first correction on the analog-to-digital converter according to the gain errors and the weight errors;

S3: extract jitter errors of all the conversion stages thereof after the first correction; and S4: perform a second correction on the analog-to-digital converter according to the jitter errors.

Figure 2:
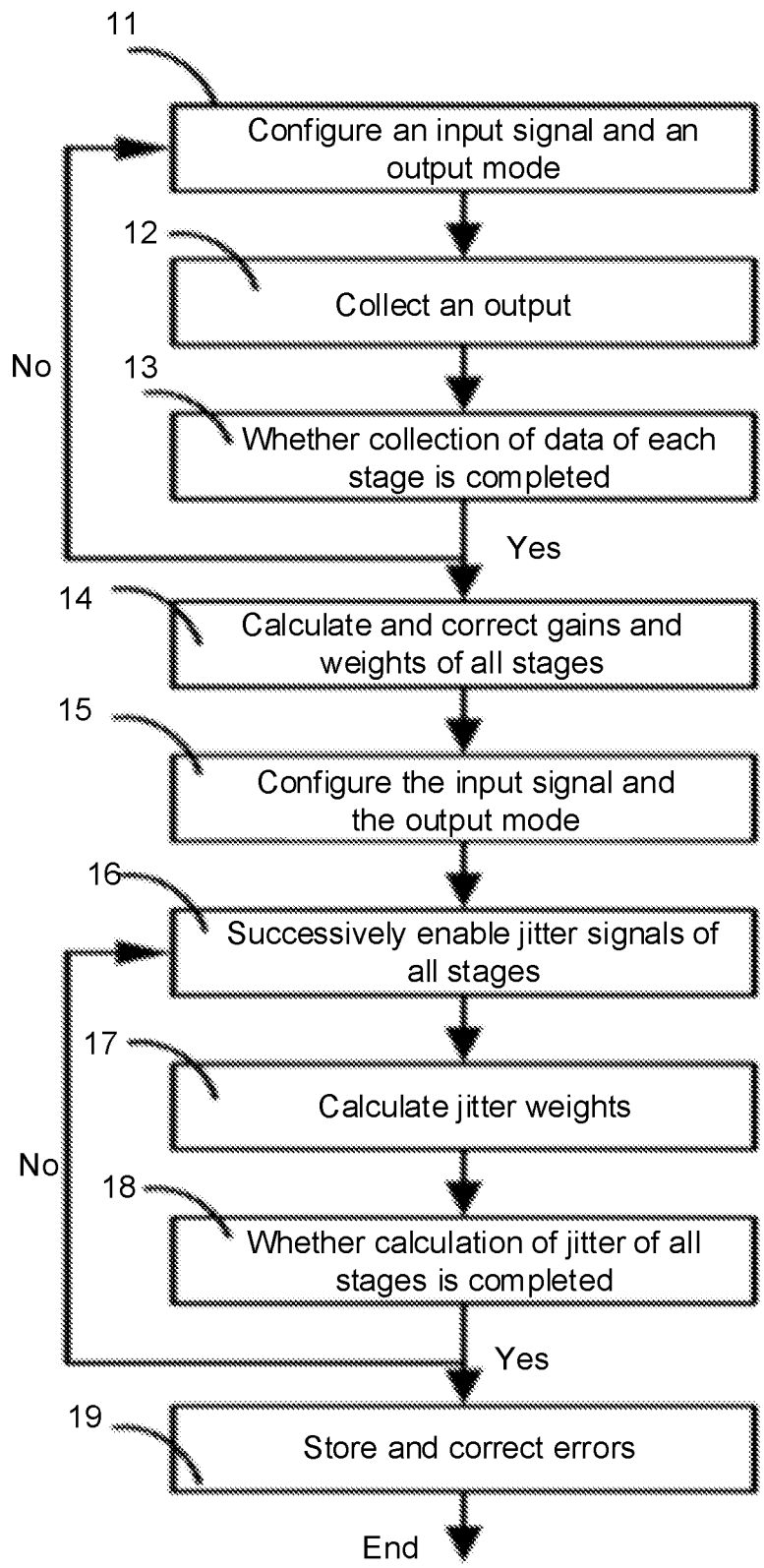
FIG. 2 is a flowchart of a method for correcting an analog-to-digital converter according to an optional embodiment of the disclosure.

In details, in an optional embodiment of the disclosure, as shown in FIG. 2, the step S1 of extracting the gain errors and the weight errors of all the conversion stages of an analog-to-digital converter further includes:

S11: for each conversion stage, configure an input signal and an output mode; this step corresponds to step 11 in FIG. 2;

S12: for each conversion stage, perform a first analog-to-digital conversion test on the analog-to-digital converter based on the input signal and the output mode, to collect first test output data; this step corresponds to step 12 in FIG. 2; and S13: for all the conversion stages, calculate the gain errors and the weight errors of all the conversion stages according to the first test output data; this step partially corresponds to step 14 in FIG. 2.

In more details, step S11 of configuring the input signal and the output mode includes: configuring an amplitude of the input signal of each stage and a threshold voltage of comparators at each stage, and configuring an output interface to send all output results of the comparators at each stage.

The analog-to-digital converter includes n conversion stages; when a gain error and a weight error of the $i^{th}$ conversion stage are extracted, a maximum value of the input signal of the $i^{th}$ stage is greater than the maximum comparator threshold of the $i^{th}$ conversion stage, and a minimum value of the input signal of the $i^{th}$ stage is smaller than the minimum comparator threshold of the $i^{th}$ conversion stage, for example, an input signal that is 1 dB less than a full amplitude is usually input; when i≥2, a threshold voltage of comparators at a pre-stage is configured so that the signal amplitude always does not exceed a comparator threshold thereof, and the input signal reaches the approximately full amplitude when the input signal is transmitted to the $i^{th}$ stage, wherein n is an integer greater than or equal to 2, and i is an integer of 1-n.

In more details, in the step S12, output data are collected, and the amount of the collected data is usually several thousands of data points. The data amount may be increased or decreased according to the precision of the analog-to-digital converter, which is not limited herein.

As shown in FIG. 2, in an optional embodiment of the disclosure, before the gain errors and the weight errors of all the conversion stages of the analog-to-digital converter are calculated and extracted, it needs to be further determined whether collection of data of each stage is completed, which partially corresponds to step 13. If the collection of data that needs to be corrected at each stage is completed, it goes to a next step, otherwise, returns to step 11, that is, an input signal is set and an output mode is configured based on an error that needs to be extracted.

Figure 3:
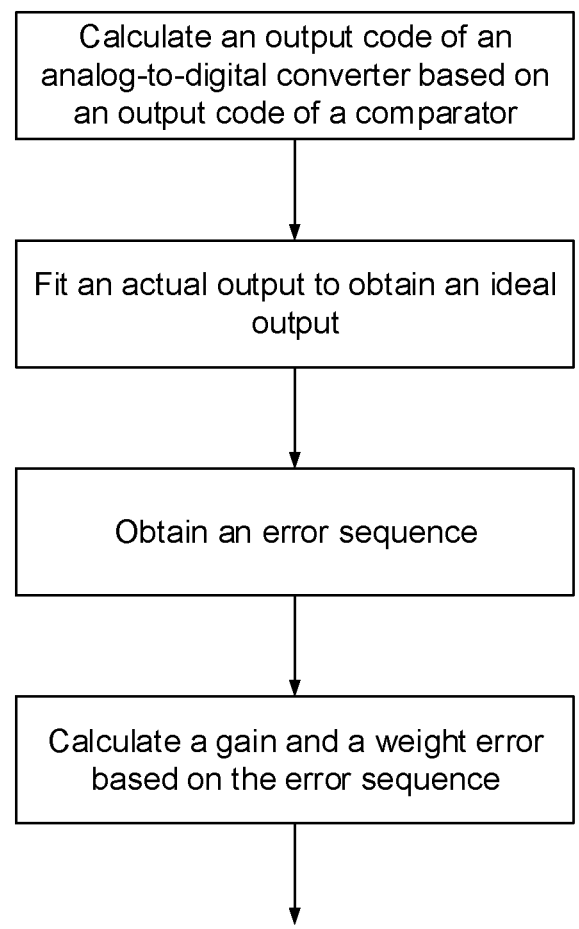
FIG. 3 is a flowchart of extracting and calculating gain errors and weight errors of all conversion stages according to an optional embodiment of the disclosure.

Specifically, in an optional embodiment of the disclosure, as shown in FIG. 3, the first test output data includes at least the output codes of the comparators at each stage, and the step S13 of calculating the gain errors and the weight errors of all the conversion stages according to the first test output data further includes:

S131: calculate an actual output sequence of the analog-to-digital converter according to the output codes of the comparators at each stage;

S132: perform a fitting output on the actual output sequence as an ideal output sequence under a constraint of a minimum mean square error according to a characteristic of the input signal;

S133: perform a subtraction operation on the actual output sequence and the ideal output sequence to obtain an error sequence; and S134: calculate the gain errors and the weight errors of the conversion stages according to the error sequence.

In more details, in the step S131, the actual output sequence of the analog-to-digital converter is obtained based on the output codes of the comparators at each stage:

$$D_{out}(m) = W_{ij\_ideal} d_{ij}(m);$$

wherein $d_{ij}(m)$ represents an output code of the $j^{th}$ comparator at the $i^{th}$ stage, $W_{ij\_ideal}$ represents an ideal weight of the $j^{th}$ quantization unit at the $i^{th}$ stage, and $D_{out}(m)$ represents an actual output sequence of the analog-to-digital converter obtained according to the output of the comparator.

In more detail, in the step S132, a fitting output sequence $\hat{D}_{out}(m)$ is obtained as an ideal output sequence under a constraint of a minimum mean square error based on a characteristic of the input signal and the actual output sequence.

In more detail, in the step S133, an error sequence is obtained according to the actual output sequence and the ideal output sequence:

$$\text{err}(m) = D_{out}(m) - \hat{D}_{out}(m);$$

wherein err(m) represents an error sequence.

In more detail, in the step S134, the actual inter-stage gain (namely, the gain error) and the actual weight (namely, the weight error) of each quantization unit are calculated based on the error sequence, and the calculation formulas for the gain error and the weight error are respectively as follows:

$$G_i(m+1) = G_i(m) - \mu_{igk} \frac{D_{ires}(m)}{2^N} \text{err}(m);$$

$$W_{ij}(m+1) = W_{ij}(m) - \mu_{iwk} \frac{d_{ij}(m) W_{ij\_ideal}}{2^N} \text{err}(m);$$

wherein $G_i(m)$ represents the $m^{th}$ iteration value of the gain error of the $i^{th}$ conversion stage, $D_{ires}(m)$ represents the $m^{th}$ iteration value of a residual error of the $i^{th}$ stage, $\mu_{igk}$ represents the $k^{th}$ iteration step size of a gain of the $i^{th}$ stage, $W_{ij}(m)$ represents the $m^{th}$ iteration value of a weight of the $j^{th}$ quantization unit at the $i^{th}$ stage, $d_{ij}(m)$ represents the $m^{th}$ comparator output corresponding to the weight of the $j^{th}$ quantization unit at the $i^{th}$ stage, $\mu_{iwk}$ represents the $k^{th}$ iteration step size of a weight of quantization units at the $i^{th}$ stage, $W_{ij\_ideal}$ represents an ideal weight of the $j^{th}$ quantization unit at the $i^{th}$ stage.

The above iteration takes a form of a variable step size, and both of the iteration step sizes $\mu_{igk}$ and $\mu_{iwk}$ are selected in a descending order, so as to increase a convergence speed thereof.

In detail, in the step S2, the first correction is performed on the analog-to-digital converter according to the gain errors and the weight errors, and a calculation formula for performing the first correction on the analog-to-digital converter is as follows:

$$D_{out\_cal} = \sum_{j=1}^{2^{k_1}} d_{1j} \cdot W_{1j} + \sum_{j=1}^{2^{k_2}} d_{2j} \cdot W_{2j} \cdot \prod_{i=1}^{1} G_i +$$

$$\sum_{j=1}^{2^{k_3}} d_{3j} \cdot W_{3j} \cdot \prod_{i=1}^{2} G_i + \ldots + \sum_{j=1}^{2^{k_n}} d_{nj} \cdot W_{nj} \prod_{i=1}^{n-1} G_i;$$

wherein $D_{out\_cal}$ represents a digital output code after the first correction and $2^{k_i}$ (i=1, 2, 3 . . . ) represents a quantity of the quantization units at the $i^{th}$ stage.

In detail, the step S3 of extracting the jitter errors of all the conversion stages of the analog-to-digital converter after the first correction further includes:

S31: for each conversion stage, configure an input signal and an output mode; this step corresponds to step 15 in FIG. 2;

S32: for each conversion stage, according to the input signal and the output mode, open and extract jitter digital codes of one stage each time, perform a second analog-to-digital conversion test on the analog-to-digital converter after the first correction and collect second test output data; this step corresponds to step 16 in FIG. 2; and S33: for all the conversion stages, calculate the jitter errors of all the conversion stages based on the jitter digital codes and the second test output data; this step corresponds to step 17 in FIG. 2.

In more detail, in the step S31, the input signal and the output mode are configured based on a quantity of errors that need to be extracted, and when the jitter errors (namely, jitter weights) are extracted, the threshold voltages of the comparators at all stages are restored to a normal working state, and no special requirement is imposed on the input signal. When the jitter errors are extracted, the input signal is set to a predetermined threshold (a signal with a small amplitude) or the input signal is disabled, so as to increase a convergence speed thereof.

In more detail, in the step S32, the jitter digital codes of all stages are opened, and only the jitter digital codes (namely, jitter signals) of one stage are opened and extracted each time. In other words, the jitter digital codes of one stage are successively opened and extracted, and the order of opening and extracting the jitter digital codes of all stages is not limited.

In more detail, in the step S33, the jitter errors of all the conversion stages are calculated according to the jitter digital codes and the second test output data. A corresponding calculation formula is as follows:

$$W_{d\_ij}(m+1) = W_{d\_ij}(m) - \mu_{diwk} \cdot dd_{ij}(m) \cdot (W_{d\_ij}(m) \cdot dd_{ij}(m) - D_{out\_cal}(m));$$

wherein $W_{d\_ij}(m)$ represents the $m^{th}$ iteration of the $j^{th}$ jitter error of the $i^{th}$ stage and $\mu_{diwk}$ represents the $k^{th}$ iteration step size of the jitter errors of the $i^{th}$ stage. The iteration takes a form of a variable step size (iteration step sizes are selected in a descending order).

After completion, the jitter signals of the current stage are disabled.

Further, as shown in the figure, the method further includes step 18 of determining whether the calculation of the jitters of all stages is completed. If the calculation is completed, it goes to a next step. If the calculation is not completed, then it returns to the step 16, that is, jitter signals of a next stage are enabled.

In detail, in the step S4, the gain errors, the weight errors and the jitter errors that are obtained through the calculation are stored, and the second correction is performed on the analog-to-digital converter based on the jitter errors. A calculation formula for performing the second correction on the analog-to-digital converter is as follows:

$$D_{out\_cal\_ditheron} = D_{out\_cal} - \sum W_{d\_ij} \cdot dd_{ij};$$

wherein $D_{out\_cal\_ditheron}$ represents a digital output code after the second correction and $dd_{ij}(m)$ represents the jitter digital code.

Figure 4:
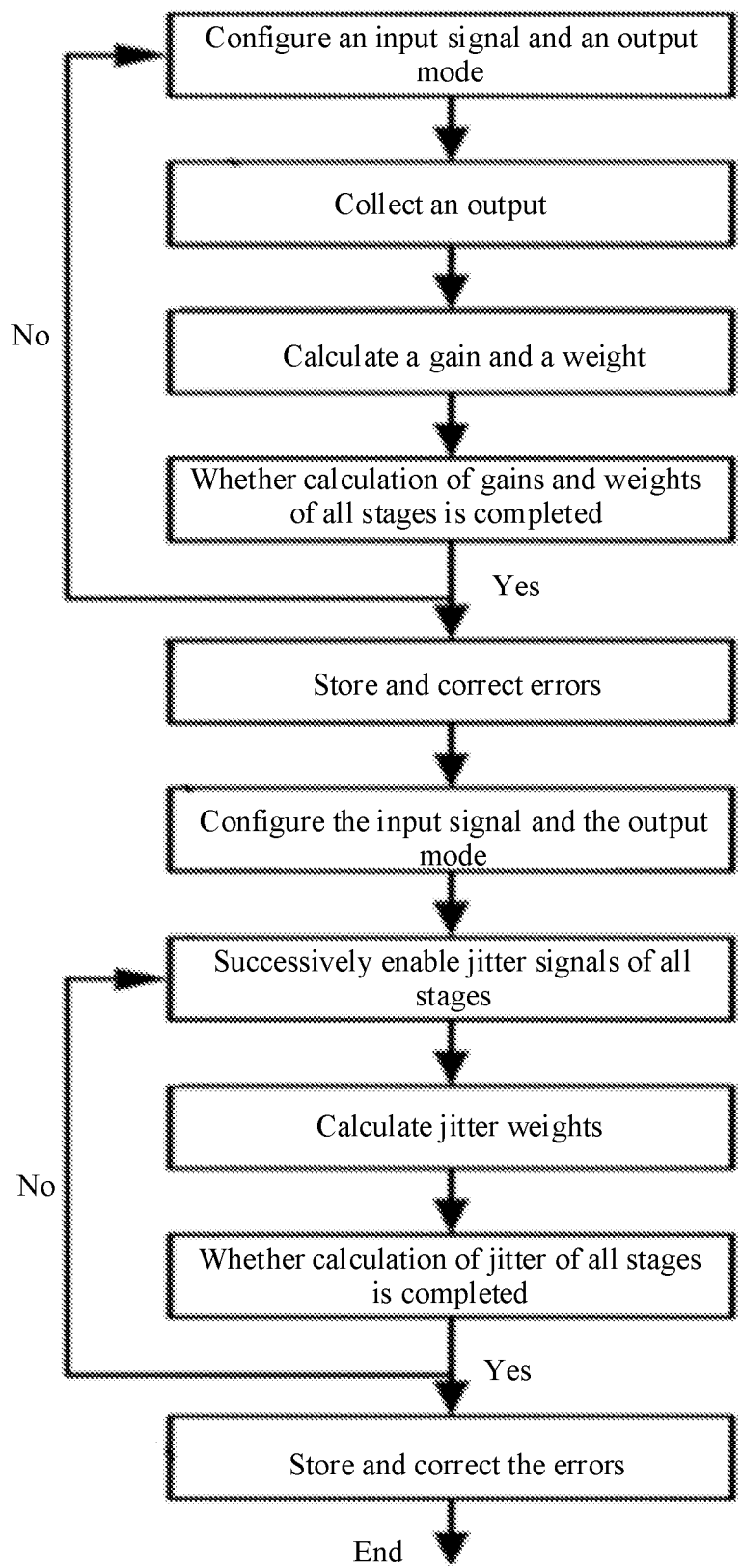
FIG. 4 is a flowchart of a method for correcting an analog-to-digital converter according to another optional embodiment of the disclosure.
Figure 5:
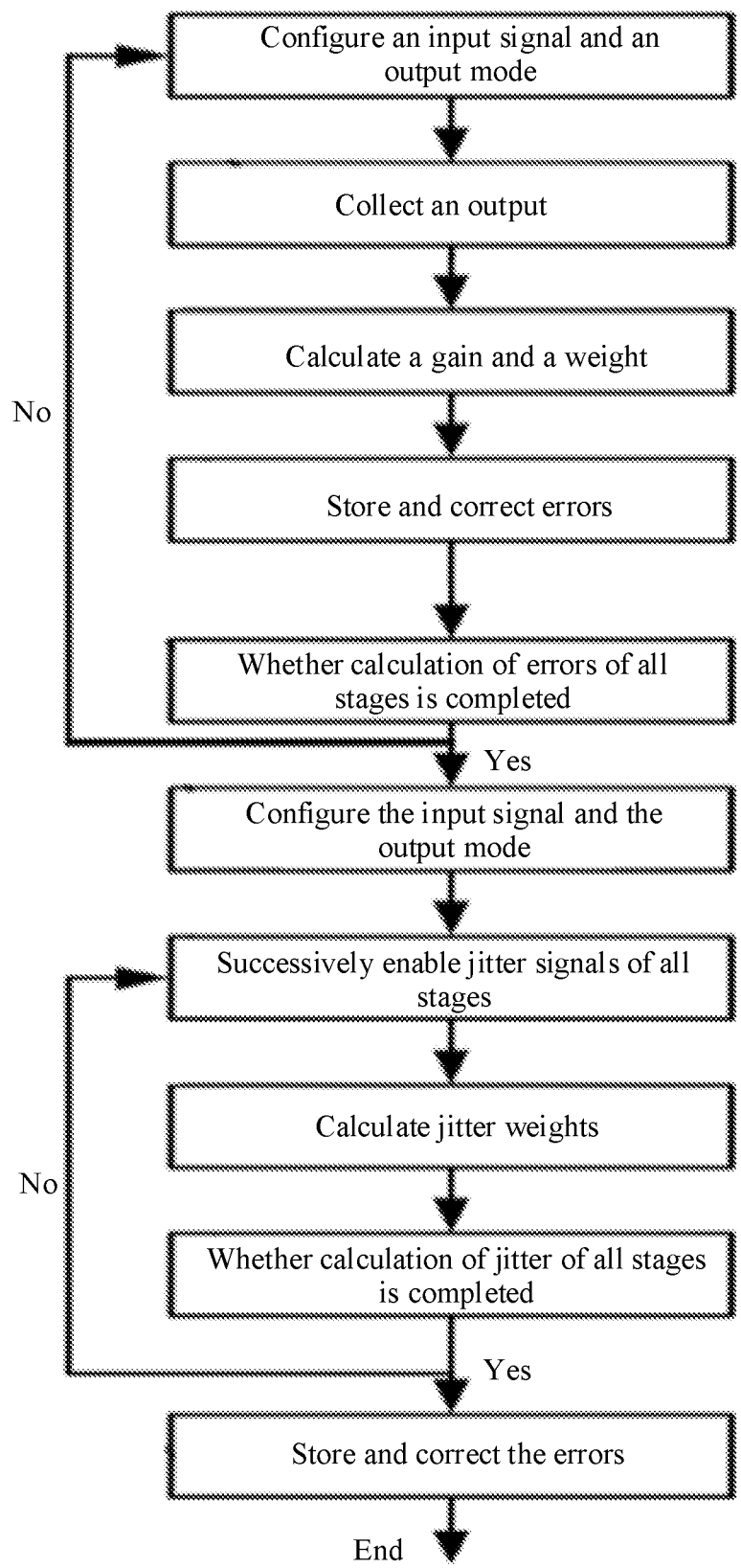
FIG. 5 is a flowchart of a method for correcting an analog-to-digital converter according to still another optional embodiment of the disclosure.

In addition, it should be noted that, because the analog-to-digital converter includes a plurality of conversion stages, a specific implementation order and manner of the steps S1~S2 may be flexibly set, and it is not limited to what is shown in FIG. 2, that unified calculation of the gain errors and the weight errors and unified first correction may be performed after the collection of data of all conversion stages is completed. It may be that, as shown in FIG. 4, after the data is collected, the gain error and the weight error of the corresponding conversion stage are calculated without waiting for the completion of data collection for all the conversion stages, until the extraction of the gain errors and the weight errors of all the conversion stages is finally completed, and then the gain errors and the weight errors of all the conversion stages are corrected in a unified manner. It may also be that, as shown in FIG. 5, a corresponding gain error and a corresponding weight error are calculated, and the first correction is performed after the data is randomly collected, until the extraction and the correction of the gain errors and the weight errors of all conversion stages are finally completed. In this case, the quantity of the corrections may be more.

In conclusion, according to the method for correcting an analog-to-digital converter provided in the disclosure, the gain errors, the weight errors and the jitter errors of all the conversion stages are successively extracted, and the correction is performed on the analog-to-digital converter twice. The precision thereof after the correction is higher. The actual weight of each quantization unit at each conversion stage is extracted thereby resolving the problem that the conventional error extraction method can be used to extract a weight of an initial conversion stage only, and cannot be used to extract weights of a plurality of conversion stages. The actual inter-stage gain of each conversion stage is extracted, and a performance degradation problem caused by a difference between an actual value and an ideal value of the inter-stage gain is corrected, thereby resolving the problem that an inter-stage gain cannot be extracted by using the conventional method. The actual weight of jitter is extracted, the impact of a jitter weight is eliminated during outputting, and a signal-to-noise ratio of analog-to-digital conversion is increased, thereby resolving the problem that the signal ratio of the analog-to-digital conversion decreases because the jitter weight cannot be extracted by using the conventional method. In this method, only a few thousands of sample points are needed, thereby resolving the problem that in a conventional extraction method based on an integral nonlinear error, sample points that need to be collected increase exponentially with the improvement of the precision of the converter. For a high-precision analog-to-digital converter, a quantity of samples that need to be collected is reduced by more than 99%. The use of the extraction method based on a variable step size greatly shortens the convergence time and reduces the costs thereof. Disabling input signals during the jitter extraction may also greatly shorten the convergence time and reduce the costs.

The foregoing embodiments merely illustrate principles and functions of the disclosure, but are not intended to limit the disclosure. Any person skilled in the art may modify or alter the foregoing embodiments without departing from the spirit and scope of the disclosure. Therefore, all equivalent modifications or alterations completed by a person of ordinary skill in the art without departing from the spirit and technical ideas disclosed in the disclosure shall still be covered by the claims of the disclosure.

What is claimed is:

1. A method for correcting an analog-to-digital converter, performed by a processor, the method comprising the following steps:
   extracting gain errors and weight errors of all conversion stages of the analog-to-digital converter;
   performing a first correction on the analog-to-digital converter according to the gain errors and the weight errors;
   extracting jitter errors of all the conversion stages of the analog-to-digital converter after the first correction; and
   performing a second correction on the analog-to-digital converter according to the jitter errors;
   wherein the step of extracting the gain errors and the weight errors of all the conversion stages of the analog-to-digital converter comprises:
      for each conversion stage, configuring an input signal and an output mode;

for each conversion stage, performing a first analog-to-digital conversion test on the analog-to-digital converter according to the input signal and the output mode, and collect first test output data; and for all the conversion stages, calculating the gain errors and the weight errors of all the conversion stages according to the first test output data;

wherein the analog-to-digital converter comprises n conversion stages; when a gain error and a weight error of the $i^{th}$ conversion stage are extracted, the maximum value of the input signal of the $i^{th}$ stage is greater than the maximum comparator threshold of the $i^{th}$ conversion stage, and the minimum value of the input signal of the $i^{th}$ stage is less than the minimum comparator threshold of the $i^{th}$ conversion stage; when i≥2, a threshold voltage of comparators at a pre-stage of the $i^{th}$ stage is configured so that the signal amplitude always does not exceed a comparator threshold, wherein n is an integer greater than or equal to 2, and i is an integer of 1–n.

2. The method for correcting an analog-to-digital converter according to claim 1, wherein the step of configuring the input signal and the output mode comprises:
configuring an amplitude of the input signal of each stage and a threshold voltage of comparators at each stage, and configuring an output interface to send all output results of the comparators at each stage.

3. The method for correcting an analog-to-digital converter according to claim 1, wherein the first test output data at least comprises output codes of the comparators at each stage, and the step of calculating the gain errors and the weight errors of all the conversion stages according to the first test output data comprises:
calculating an actual output sequence of the analog-to-digital converter according to the output codes of the comparators at each stage;
performing a fitting output on the actual output sequence as an ideal output sequence under a constraint of a minimum mean square error according to a characteristic of the input signal;
performing a subtraction operation on the actual output sequence and the ideal output sequence to obtain an error sequence; and
calculating the gain errors and the weight errors of the conversion stages according to the error sequence.

4. The method for correcting an analog-to-digital converter according to claim 3, wherein calculation formulas for the gain error and the weight error are respectively as follows:

$$G_i(m+1) = G_i(m) - \mu_{igk} \frac{D_{ires}(m)}{2^N} \text{err}(m);$$

$$W_{ij}(m+1) = W_{ij}(m) - \mu_{iwk} \frac{d_{ij}(m) W_{ij\_ideal}}{2^N} \text{err}(m);$$

wherein $G_i(m)$ represents the $m^{th}$ iteration value of the gain error of the $i^{th}$ conversion stage, $D_{ires}(m)$ represents the $m^{th}$ iteration value of a residual error of the $i^{th}$ stage, $\mu_{igk}$ represents the $k^{th}$ iteration step size of a gain of the $i^{th}$ stage, $W_{ij}(m)$ represents the $m^{th}$ iteration value of a weight of the $j^{th}$ quantization unit at the $i^{th}$ stage, $d_{ij}(m)$ represents the $m^{th}$ comparator output corresponding to the weight of the $j^{th}$ quantization unit at the $i^{th}$ stage, $\mu_{iwk}$ represents the $k^{th}$ iteration step size of a weight of quantization units at the $i^{th}$ stage, $W_{ij\_ideal}$ represents an ideal weight of the $j^{th}$ quantization unit at the $i^{th}$ stage, err(m) represents an error sequence, and N represents resolution ratio of the analog-to-digital converter.

5. The method for correcting an analog-to-digital converter according to claim 4, wherein the iteration takes a form of a variable step size, and both the iteration step sizes $\mu_{igk}$ and $\mu_{iwk}$ are selected in a descending order, so as to increase a convergence speed thereof.

6. The method for correcting an analog-to-digital converter according to claim 4, wherein a calculation formula for performing first correction on the analog-to-digital converter according to the gain errors and the weight errors is as follows:

$$D_{out\_cal} = \sum_{j=1}^{2^{k_1}} d_{1j} \cdot W_{1j} + \sum_{j=1}^{2^{k_2}} d_{2j} \cdot W_{2j} \cdot \prod_{i=1}^{1} G_i +$$
$$\sum_{j=1}^{2^{k_3}} d_{3j} \cdot W_{3j} \cdot \prod_{i=1}^{2} G_i + \ldots + \sum_{j=1}^{2^{k_n}} d_{nj} \cdot W_{nj} \prod_{i=1}^{n-1} G_i;$$

wherein $D_{out\_cal}$ represents a digital output code after the first correction and $2^{k_i}$ (i=1, 2, 3 . . . ) represents a quantity of the quantization units at the $i^{th}$ stage.

7. The method for correcting an analog-to-digital converter according to claim 1, wherein the step of extracting jitter errors of all conversion stages of the analog-to-digital converter after the first correction comprises:
for each conversion stage, configuring an input signal and an output mode;
for each conversion stage, opening and extracting jitter digital codes of one stage each time according to the input signal and the output mode, performing second analog-to-digital conversion test on the analog-to-digital converter after the first correction, and collecting second test output data; and
for all the conversion stages, calculating the jitter errors of all the conversion stages based on the jitter digital codes and the second test output data.

8. The method for correcting an analog-to-digital converter according to claim 7, wherein when the jitter errors are extracted, the threshold voltages of the comparators at all stages are restored to a normal working state.

9. The method for correcting an analog-to-digital converter according to claim 7, wherein when the jitter errors are extracted, the input signal is set to a predetermined threshold or the input signal is disabled, so as to increase a convergence speed.

10. The method for correcting an analog-to-digital converter according to claim 7, wherein the jitter digital codes of one stage are successively opened and extracted, and an order of opening and extracting the jitter digital codes of all stages is not limited.

11. The method for correcting an analog-to-digital converter according to claim 7, wherein a calculation formula for calculating the jitter errors of all the conversion stages based on the jitter digital codes and the second test output data is as follows:

$$W_{d\_ij}(m+1) = W_{d\_ij}(m) - \mu_{diwk} \cdot dd_{ij}(m) \cdot (W_{d\_ij}(m) \cdot dd_{ij}(m) - D_{out\_cal}(m));$$

wherein $W_{d\_ij}(m)$ represents the $m^{th}$ iteration of the $j^{th}$ jitter error of the $i^{th}$ stage and $\mu_{diwk}$ represents the $k^{th}$ iteration step size of the jitter errors of the $i^{th}$ stage.

12. The method for correcting an analog-to-digital converter according to claim 11, wherein a calculation formula for performing the second correction on the analog-to-digital converter according to the jitter errors is as follows:

$$D_{out\_cal\_ditheron} = D_{out\_cal} - \sum W_{d\_ij} \cdot dd_{ij};$$

wherein $D_{out\_cal\_ditheron}$ represents a digital output code after the second correction and $dd_{ij}(m)$ represents the jitter digital code.

* * * * *